US006815248B2

(12) United States Patent
Leuschner et al.

(10) Patent No.: US 6,815,248 B2
(45) Date of Patent: Nov. 9, 2004

(54) MATERIAL COMBINATIONS FOR TUNNEL JUNCTION CAP LAYER, TUNNEL JUNCTION HARD MASK AND TUNNEL JUNCTION STACK SEED LAYER IN MRAM PROCESSING

(75) Inventors: Rainer Leuschner, Mohegan Lake, NY (US); George Stojakovic, Hopewell Junction, NY (US); Xian J. Ning, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/124,950

(22) Filed: Apr. 18, 2002

(65) Prior Publication Data

US 2003/0199104 A1 Oct. 23, 2003

(51) Int. Cl.[7] ............................................... H01L 21/00
(52) U.S. Cl. ............................. 438/59; 438/3; 438/48; 438/396; 438/244; 438/250; 438/253; 438/239; 257/71; 257/252; 257/295; 257/298; 257/303; 257/414
(58) Field of Search ........................ 438/59, 3, 48, 438/239–253, 396; 257/71, 252, 298–303, 295, 414, 424–427

(56) References Cited

U.S. PATENT DOCUMENTS

| 6,097,579 | A | * | 8/2000 | Gill | 360/324.2 |
|---|---|---|---|---|---|
| 6,127,045 | A | * | 10/2000 | Gill | 428/611 |
| 6,219,212 | B1 | * | 4/2001 | Gill et al. | 360/324.2 |
| 6,379,978 | B2 | * | 4/2002 | Goebel et al. | 438/3 |
| 6,392,257 | B1 | * | 5/2002 | Ramdani et al. | 257/190 |
| 6,518,588 | B1 | * | 2/2003 | Parkin et al. | 257/3 |
| 6,538,920 | B2 | * | 3/2003 | Sharma et al. | 365/171 |
| 6,633,497 | B2 | * | 10/2003 | Nickel | 365/158 |
| 2002/0097600 | A1 | * | 7/2002 | Ning | 365/171 |
| 2002/0098676 | A1 | * | 7/2002 | Ning et al. | 438/622 |
| 2002/0146580 | A1 | * | 10/2002 | Wang et al. | 428/469 |
| 2002/0196647 | A1 | * | 12/2002 | Nickel | 365/46 |
| 2003/0021908 | A1 | * | 1/2003 | Nickel et al. | 427/551 |
| 2003/0047728 | A1 | * | 3/2003 | Chen | 257/10 |
| 2003/0073251 | A1 | * | 4/2003 | Ning | 438/3 |
| 2003/0132468 | A1 | * | 7/2003 | Raberg | 257/295 |
| 2003/0170985 | A1 | * | 9/2003 | Hwang et al. | 438/689 |

\* cited by examiner

*Primary Examiner*—Matthew Smith
*Assistant Examiner*—Granvill D. Lee, Jr.
(74) *Attorney, Agent, or Firm*—Slater & Matsil, L.L.P.

(57) ABSTRACT

A resistive memory device (110) and method of manufacturing thereof comprising a cap layer (140) and hard mask layer (142) disposed over magnetic stacks (114), wherein either the cap layer (140) or hard mask layer (142) comprise WN. A seed layer (136) disposed beneath the magnetic stacks (114) may also be comprised of WN, The use of the material WN improves etch process selectivity during the manufacturing process.

28 Claims, 3 Drawing Sheets

US 6,815,248 B2

MATERIAL COMBINATIONS FOR TUNNEL JUNCTION CAP LAYER, TUNNEL JUNCTION HARD MASK AND TUNNEL JUNCTION STACK SEED LAYER IN MRAM PROCESSING

TECHNICAL FIELD

The present invention relates generally to the fabrication of semiconductor devices, and more particularly to the fabrication of magnetic random access memory (MRAM) devices.

BACKGROUND OF THE INVENTION

Semiconductors are widely used for integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

Spin electronics combines semiconductor technology and magnetics, and is a more recent development in memory devices. In spin electronics, the spin of an electron, rather than the charge, is used to indicate the presence of a "1" or "0". One such spin electronic device is an MRAM device, which includes conductive lines positioned in different directions to one another in different metal layers, the conductive lines sandwiching a magnetic stack. The place where the conductive lines, e.g., wordlines and bitlines, intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic component depends on the moment's alignment. The stored state is read from the element by detecting the component's resistive state. A memory cell array is generally constructed by placing the conductive lines and cross-points in a matrix structure having rows and columns.

An advantage of MRAM devices compared to traditional semiconductor memory devices such as DRAM devices is that MRAM devices are non-volatile. For example, a personal computer (PC) utilizing MRAM devices would not have a long "boot-up" time as with conventional PCs that utilize DRAM devices. Also, an MRAM device does not need to be powered up and has the capability of "remembering" the stored data. MRAM devices have the potential to eliminate the boot up process, store more data, access that data faster and use less power than current memory technologies.

Because MRAM devices operate differently than traditional memory devices, they introduce design and manufacturing challenges.

SUMMARY OF THE INVENTION

Preferred embodiments of the present invention achieve technical advantages by providing material combinations that optimize etch processes for resistive memory elements. In the preferred embodiment, for example, the material tungsten nitride (WN) is used for the tunnel junction hard mask or cap layer, and/or the tunnel junction stack seed layer of an MRAM device.

In one embodiment, a method of fabricating a resistive semiconductor memory device includes providing a workpiece, forming a first inter-level dielectric over the workpiece, and disposing a plurality of first conductive lines within the first inter-level dielectric. The method also includes forming a seed layer over the first conductive lines, forming a first magnetic layer over the seed layer, and forming a tunnel barrier layer over the first magnetic layer. A second magnetic layer is deposited over the tunnel barrier, a cap layer is deposited over the second magnetic layer, and a hard mask material is deposited over the cap layer. The method includes patterning the hard mask material to form a hard mask, and using the patterned hard mask to pattern the cap layer, second magnetic layer, and tunnel barrier layer to form a plurality of tunnel junctions. At least one of depositing a cap layer, depositing a hard mask material or depositing a seed layer comprise depositing WN.

In another embodiment, a resistive semiconductor memory device includes a plurality of first conductive lines, a seed layer disposed over at least a portion of the first conductive lines, and a first magnetic stack disposed over the seed layer. A tunnel barrier is disposed over the first magnetic stack, a second magnetic stack disposed over the tunnel barrier, and a cap layer is disposed over the second magnetic stack, wherein at least one of the seed layer and the cap layer comprise WN.

Advantages of embodiments of the invention include improvement of the process window for the tunnel junction hard mask open reactive ion etch (RIE) process and subsequent tunnel junction etch with an optional etch stop on a seed layer to prevent corrosion of the metal of the first conductive lines.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Prior art MRAM process flows and materials will be described, followed by a discussion of some preferred embodiments of the present invention and some advantages thereof.

To manufacture MRAM devices, typically, magnetic metal stacks are embedded in the back-end-of-line (BEOL) while manufacturing the integrated circuits (IC's). A magnetic stack typically comprises many different layers of metals with a thin layer of dielectric therebetween. The magnetic stack may have a total thickness of a few tens of nanometers, for example. For cross-point MRAM structures, the magnetic stack is usually located at the intersection of two metal wiring levels, for example, at the intersection of metal 2 (M2) and metal 3 (M3) layers that run in different directions positioned at an angle to one another. The tops and bottoms of the magnetic stacks typically contact the M(n) and M(n+1) wiring layer conductive lines, respectively.

Figure 1:
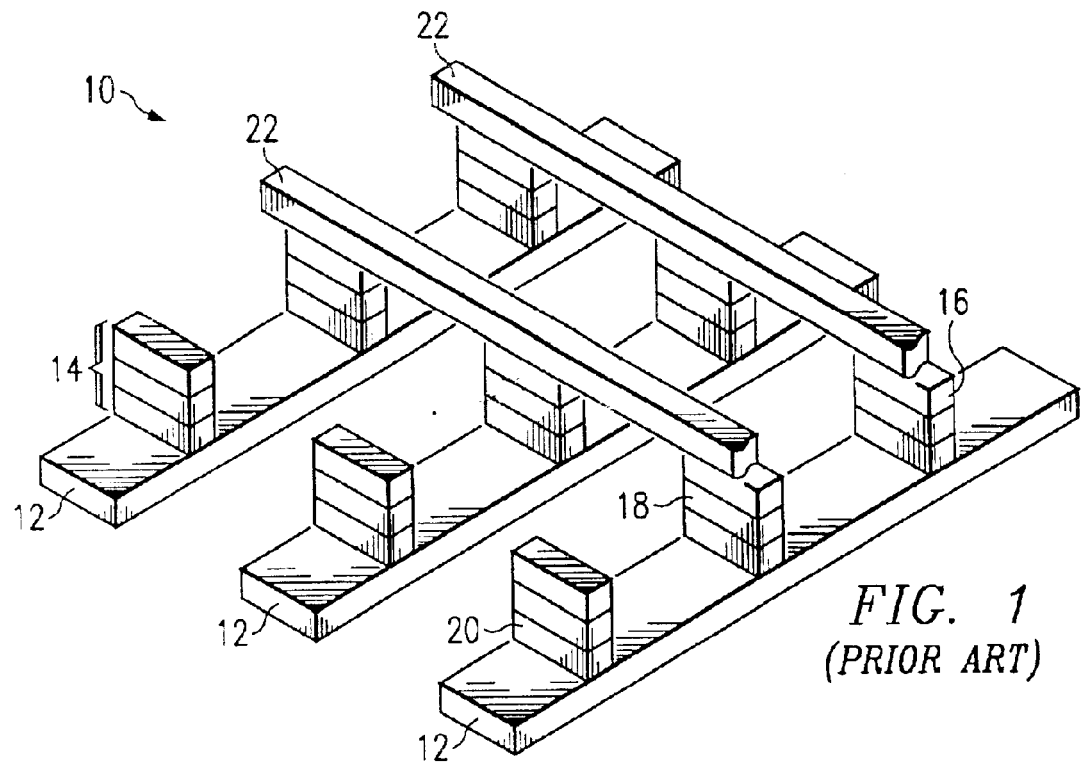
FIG. 1 illustrates a perspective view of a prior art MRAM device having magnetic stack memory cells arranged in an array, with wordlines and bitlines disposed below and above each memory cell for accessing the memory cells.
Figure 2:
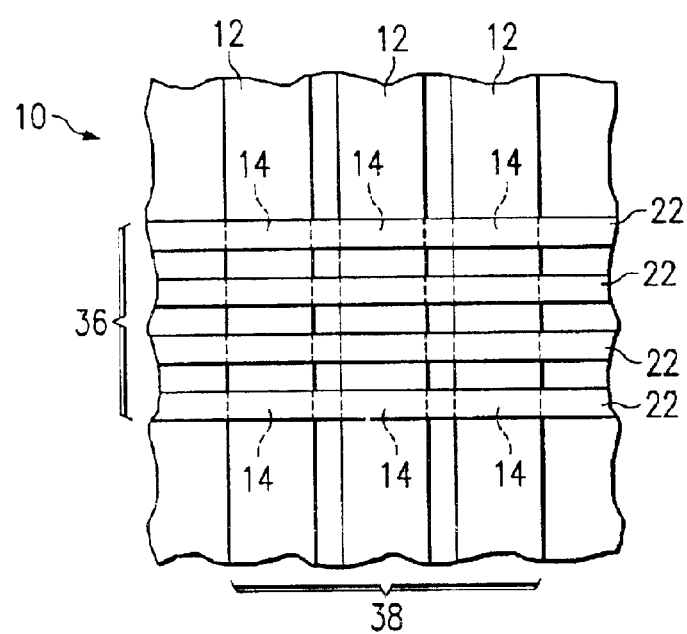
FIG. 2 shows a top view of the MRAM device shown in FIG. 1.

A prior art MRAM device 10 having conductive lines 12 and 22 running in a first and second direction and comprised of a conductive material such as aluminum or copper, for example, is shown in FIG. 1. A first inter-level dielectric (ILD) layer (not shown) is deposited over a workpiece (not shown). A metallization layer is formed, typically in the inter-level dielectric layer, using a damascene process to form the conductive lines 12. A magnetic stack 14 is formed over conductive lines 12.

The magnetic stack 14 typically comprises a first magnetic layer 20 including a plurality of layers of materials such as PtMn, CoFe, Ru, and NiFe, for example. The first magnetic layer 20 is often referred to as a hard layer or reference layer. The first magnetic layer 20 may include a seed layer disposed over the first conductive lines 12, not shown. The seed layer typically comprises TaN, to prevent corrosion of the first conductive lines 12 during the etching of the magnetic stack 14.

Magnetic stack 14 also includes a dielectric layer 18, comprising $Al_2O_3$, for example, deposited over the first magnetic layer 20. The dielectric layer 18 is often referred to as a tunnel layer, tunnel barrier or T-barrier. The magnetic stack 14 also includes a second magnetic layer 16 comprising a multi-layer structure having similar materials as the first magnetic layer 20 deposited over the dielectric layer 18. The second magnetic layer 16 is often referred to as a soft layer or free layer. The first magnetic layer 20, dielectric layer 18 and second magnetic layer 16 are patterned to form magnetic stacks 14.

Conductive lines 22 within a metallization layer running in a different direction than, e.g., perpendicular to, conductive lines 12 are formed over magnetic stacks 14, typically using a damascene process, within a dielectric layer (not shown) deposited over magnetic stacks 14 and conductive lines 22. Conductive lines 12 and 22 function as the wordlines and bitlines of the memory array 10. The order of the magnetic stack 14 layers may be reversed, e.g., the hard layer 20 may be on the top and the soft layer 16 may be on the bottom of the insulating layer 18, for example. Similarly, the wordlines 12 and bitlines 22 may be disposed either above or below the magnetic stacks 14. For a FET-like MRAM design, for example, an oxide layer (not shown) may be disposed between either the first and second conductive lines 12/22, and the oxide layer may be patterned to provide via holes which are then filled with a conductor to couple the magnetic stacks 14 to a field effect transistor (FET).

In an MRAM device, information is stored in the soft magnetic layer or free layer 16 of the magnetic stacks 14. To store the information, a magnetic field is necessary. This magnetic field is provided by a wordline and bitline current which is passed through conductive lines 12 and 22. The information is read by applying a voltage to the particular cell to be read, and determining the resistance value of the cell, which indicates a "1" or "0" logic state.

Figure 3:
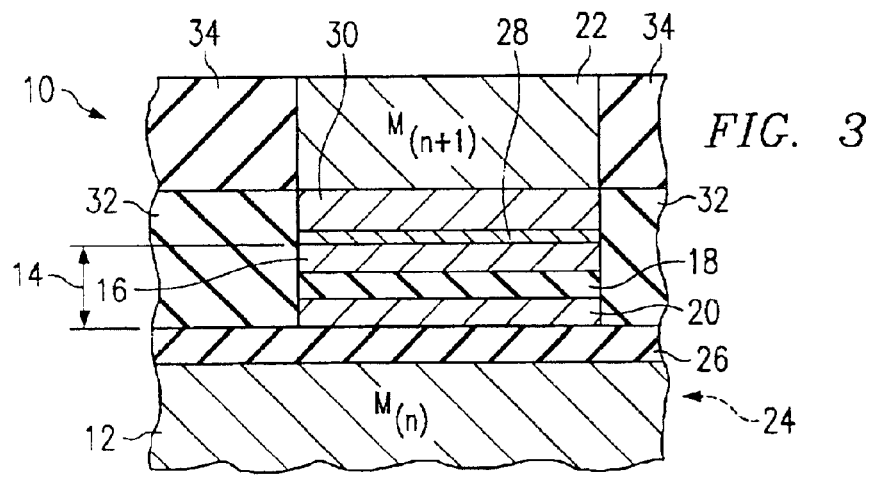
FIG. 3 shows a cross-sectional view of an MRAM device.

FIG. 3 is a cross-sectional view of a MRAM device 10, showing the various insulating layers between conductive elements of the MRAM. First conductive lines 12 are insulated from one another by a first inter-level dielectric 24 (shown in phantom because dielectric 24 is not in view in FIG. 3), and second conductive lines 22 are insulated from one another by a second inter-level dielectric 34. The resistive memory elements or TJ's 14, a cap layer 28 and a hard mask 30 are insulated from one another by an insulating layer or TJ sidewall isolation layer 32.

Processing an MRAM magnetic stack 14 or tunnel junction (TJ) processing requires using different materials for the inter-level dielectric 24/34 between the metallization layers M(n) and M(n+1) 12/22, the TJ 14 sidewall isolation layer 32, the hard mask 30 for the TJ 14 etch, and the TJ stack cap layer 28. It is desirable for the hard mask 30 to be conductive and have good stability during the TJ 14 etch. The TJ stack cap layer 28 is desired to be conductive, protect the magnetic materials 16 from oxidation, and provide an etch stop for the hard mask 30 open and/or hard mask 30 removal reactive ion etch (RIE).

The four materials, namely, the metallization layer inter-level dielectrics (ILD's) 24/34, the TJ sidewall insulator 32, hard mask material 30 and cap layer 28 are related to each other because they may be etched selectively to each other in order to achieve a reasonable process window. Thus, material selections for the hard mask 30 versus the cap layer 28, and the ILD 24/34 versus the hard mask 30 and TJ isolation 32 are linked by the etch selectivity of the various materials.

In MRAM processing, $SiO_2$ is typically used as the metallization layer ILD 24/34, meaning that the TJ isolation material 32 should be something other than $SiO_2$ for etch selectivity. Furthermore, both the TJ isolation material 32 and TJ hard mask material 30 preferably comprise a material with good etch selectivity to $SiO_2$ RIE, e.g., a metallization layer M3 etch. Therefore, $Si_3N_4$ may be used as the TJ isolation material 32, and TiN or TaN may be used as a TJ cap layer 28 and/or TJ hard mask 30. The TJ hard mask 30 preferably comprises a thickness of approximately 150 nm.

However, if TiN or TaN are used for the hard mask 30 open RIE, e.g., the patterning of the hard mask 30 with RIE, stopping the hard mask 30 open RIE on the cap layer 28 is problematic. In order to achieve good process latitudes, it is desirable to have a precise stop of the TJ hard mask 30 open RIE because this helps to define precisely how long the TJ 14 etch process has to be performed without over-etching into the metallization lines 12 underneath the TJ 14.

A thin TJ stack cap layer 28 comprising, for example, 10 nm of TaN is disposed over the TJ 14 beneath the hard mask 30, as shown in FIG. 3. In this application, it is desired that the cap layer 28 have the following properties: oxidation protection for magnetic materials of the TJ stack 14, as low as possible etch rate in the hard mask open RIE, and as low as possible sheet resistance, even after being exposed to the hard mask 30 removal RIE.

Typically, the cap layer 28 comprises TaN, which has a specific resistance of 1.8 ohm $\mu$m and has poor etch selectivity to the hard mask 30 open RIE, which means that the hard mask 30 open RIE needs to be timed or based on endpoint detection.

The seed layer of the reference layer 20 of the magnetic stack 14 typically comprises TaN, which is disadvantageous if the stack 14 is etched in a chlorine plasma, because there is no etch stop available for the TaN without the risk of breaking through the TaN and corroding the underlying conductive lines 12, which may comprise Cu, for example, with the chlorine.

Embodiments of the present invention achieve technical advantages by providing a plurality of material combinations for the tunnel junction cap layer, tunnel a junction hard mask, and other material layers, including the stack seed layer, that provide improved etch process selectivity. The cap layer or the hard mask layer is comprised of WN, which is advantageous in that WN is stabile in an oxidizing environment, and has excellent etch selectivity to hard mask open RIE processes.

Figure 4:
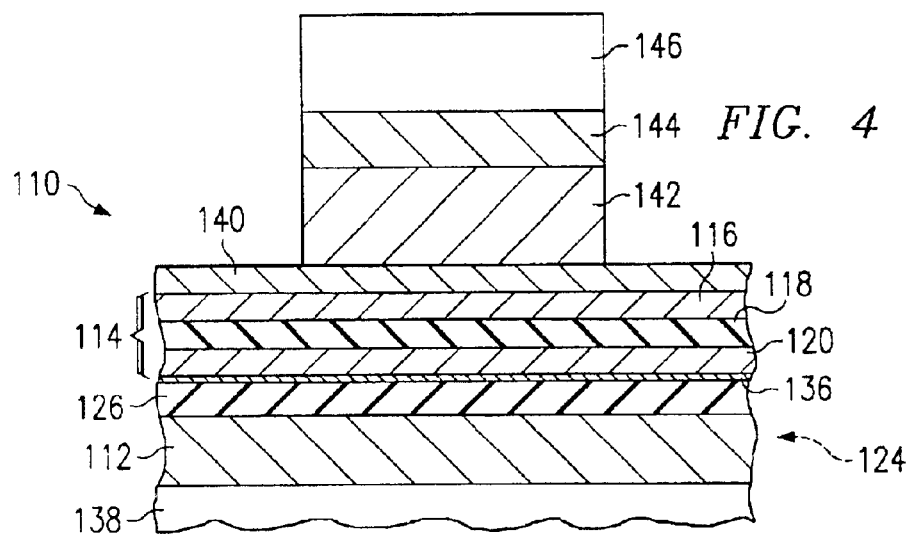
FIGS. 4 through 6 show cross-sectional views of an MRAM device at various stages of fabrication in accordance with an embodiment of the invention.
Figure 5:
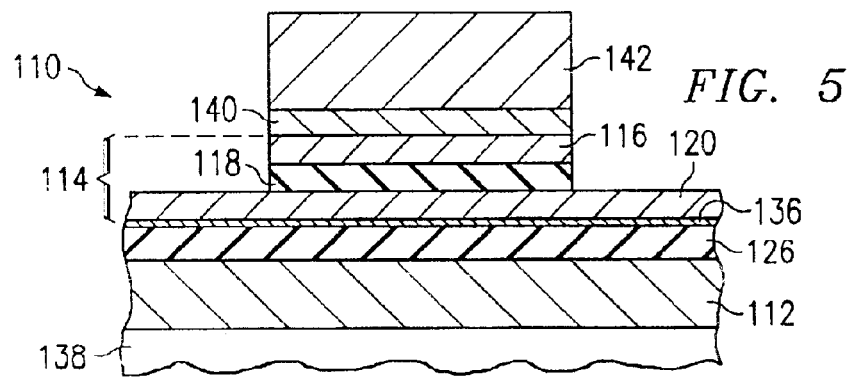
Figure 6:
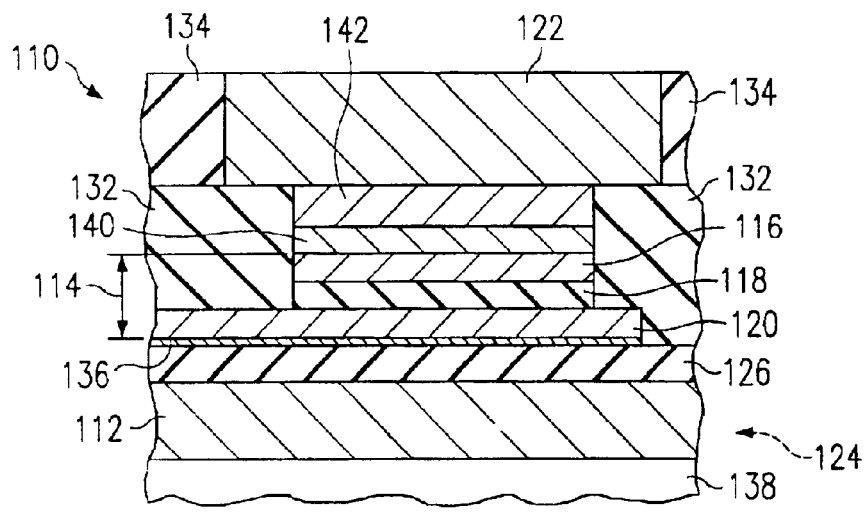

FIGS. 4 through 6 show cross-sectional views of an MRAM device 110 at various stages of fabrication in accordance with an embodiment of the invention. FIG. 4 shows a semiconductor wafer including a workpiece 138. The workpiece 138 may include a semiconductor substrate comprising silicon or other semiconductor materials covered by an insulating layer, for example. The workpiece 138 may also include other active components or circuits formed in the front end of the line (FEOL), not shown. The workpiece 138 may comprise silicon oxide over single-crystal silicon, for example. The workpiece 138 may include other conductive layers or other semiconductor elements, e.g. transistors, diodes, etc. Compound semiconductors such as GaAs, InP, or SiC, or Si/Ge, as examples, may be used in place of silicon.

An optional thin cap layer, not shown, may be formed over the workpiece 138. The cap layer preferably comprises a thin layer of protective material adapted to prevent diffusion of the metal used for first conductive lines 112 into the workpiece 138. For example, if copper is used for the first conductive line 112 material, copper has a tendency to diffuse into underlying and overlying dielectrics unless a cap layer is used. Because copper oxidizes easily, when the first conductive lines 112 comprise copper, preferably, cap layer comprises a material other than an oxide, to avoid oxidation of first conductive lines 112. The cap layer may comprise a nitride such as $Si_3N_4$, for example.

A first insulating layer 124 (not in view in FIG. 4; shown in phantom) is deposited over the cap layer. The first insulating layer 124 preferably comprises an inter-level dielectric (ILD) layer, e.g., the wafer first inter-level dielectric. The first insulating layer 124 preferably comprises silicon dioxide ($SiO_2$) and may alternatively comprise other dielectric materials such as low dielectric constant materials, for example. In a preferred embodiment of the invention, preferably the ILD 124 comprises an-organic dielectric material, such as SILK, a registered trademark of Dow Chemical Company, as an example, to be described further herein.

The first insulating layer 124 is patterned, etched, and filled with a conductive material to form first conductive lines 112, e.g., using a damascene process. The pattern and fill process may comprise a single damascene or dual-damascene process, with vias being filled at the same time first conductive lines 112 are filled, not shown for example. The first insulating layer 124 may be lithographically patterned and reactive ion etched (RIE) to form trenches where first conductive lines 112 will be formed. The trenches may be 0.2 μm wide and 0.4 to 0.6 μm deep, as examples.

Depending on the conductive material used, conductive lines 112 may include an optional liner, not shown. For example, if first conductive lines 112 comprise copper, preferably, a liner is used which comprises a copper liner deposited over the wafer surface within the trenches, including along the trench sidewalls. Conductive material is then deposited over the wafer 110 and within the trenches. First conductive lines 112 may comprise minimum pitched lines (e.g., having the smallest feature size) or larger pitched lines. The wafer 110 is chemically-mechanically polished (CMP'd) to remove the excessive conductive material 112 above the top surface of the first insulating layer 124.

The first conductive lines 112 comprise a conductive material preferably comprising a metal such as copper, and alternatively comprising other conductive materials such as Al, TiN, Ti, W, combinations thereof, or other conductive materials, deposited by physical vapor deposition (PVD) or chemical vapor deposition (CVD), as examples. Conductive lines 112 in an MRAM preferably comprise copper, which is desirable for its superior conductivity and the ability to use smaller conductive lines because of the improved conductivity of the copper. A damascene process is preferably used to form conductive lines 112 comprising copper, because copper is difficult to etch. First conductive lines 112 may be part of an M1 or M2 metallization layer, as examples.

An optional oxide layer 126 is deposited over the first conductive lines 112 and ILD 124. The oxide layer 126 preferably comprises $SiO_2$, and may alternatively comprise other oxides, as examples. An oxide layer 126 is typically used in FET-like MRAM architectures, wherein the oxide 126 is patterned and conductors are formed therein to couple to an underlying FET within the workpiece 138 that is used to read information from the resistive memory elements 114.

A seed layer 136 is deposited or formed over the oxide layer 126. In an embodiment of the invention, the seed layer 136 preferably comprises WN, although alternatively, the seed layer 136 may comprise TaN, as an example. If the seed layer 136 for the stack 114 deposition comprises WN, then the stack 114 etch will stop on the seed layer 136 when a chlorine based chemistry is used for the stack etch 114. After stopping on the seed layer 136, the WN may be etched in a fluorine-based chemistry.

Next, a magnetic stack 114 is formed over first conductive lines 112 and first insulating layer 124. The magnetic stack 114 preferably comprises a first magnetic layer 120 comprised of a plurality of layers of materials such as PtMn, CoFe, Ru, NiFe, Ni, Co, and/or combinations thereof, using various ratios of these chemical elements, as examples.

The magnetic stack 114 includes a dielectric layer or tunnel barrier 118, comprising aluminum oxide ($Al_2O_3$), for example, deposited over the first magnetic layer 120. The magnetic stack 114 also includes a second magnetic layer 116 deposited over the dielectric layer 118, the second magnetic layer 116 comprising a similar multi-layer structure using similar materials as the first magnetic layer 120.

A cap layer 140 is deposited over the second magnetic layer 116, as shown in FIG. 4. A hard mask material 142 is disposed over the cap layer 140. The hard mask material 142 and cap layer 140 preferably comprise different materials. In one embodiment, the cap layer 140 comprises WN and the hard mask material 142 comprises TiN or TaN. In another embodiment, the hard mask material 142 comprises WN and the cap layer 140 comprises TiN or TaN. The hard mask material 142 preferably comprises approximately 200 to 2000 Å of a conductive material, and the cap layer 140 preferably comprises approximately 75 to 250 Å of material, as examples.

An anti-reflective coating (ARC) 144 is preferably deposited over the hard mask material 142. The anti-reflective coating may comprise an energy-absorbing organic polymer or carbon material, as examples. A resist 146 is deposited over the anti-reflective coating 146. The resist 146 is patterned, and portions of the resist 146 are removed to expose regions of the hard mask material 142.

The hard mask material 142 is then patterned, using the resist 146 as a mask, and the resist 146 and portions of the anti-reflective coating 144 and the hard mask 142 are removed, as shown in FIG. 5. The hard mask 142 is then used to pattern the second magnetic layer 116 and tunnel barrier 118 of the stack 114, as shown in FIG. 6. An etch process such as reactive ion etching (RIE), or ion milling, as examples, may be used to transfer the pattern the second magnetic layer 116 and tunnel barrier 118, stopping just below the tunnel barrier 118. The magnetic tunnel junctions (MTJ's) 114 may be rectangular or oval in shape, for example, and alternatively may comprise other shapes.

The first magnetic layer 120 or reference layer has a different pattern than the second magnetic layer 116 and tunnel barrier 118, and therefore the first magnetic layer 120 is patterned either before or after the second magnetic layer 116 and tunnel barrier 118 of the stack 114 are patterned.

Figure 8:
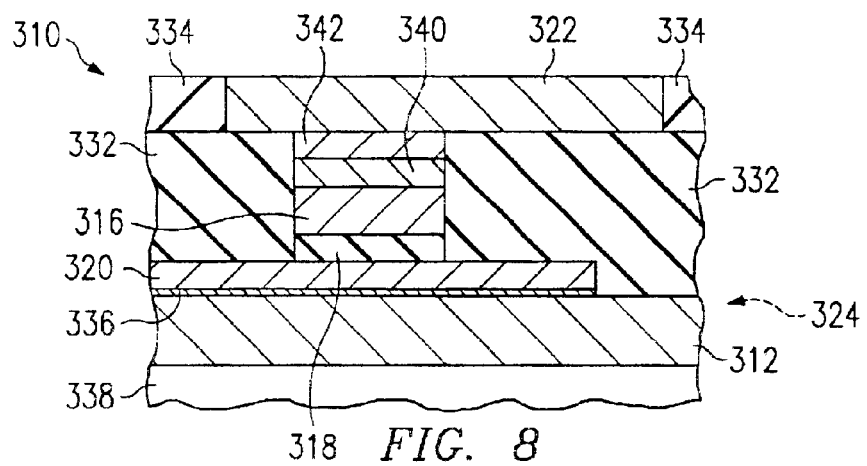
FIG. 8 shows a cross-sectional view of an embodiment of the invention in a cross-point MRAM architecture, absent an oxide layer over first conductive lines.

In FET-like MRAM architectures, it is not as critical where to stop the stack 114 etch, because the oxide layer 126 between the stack 114 and conductive line 112 acts as a buffer for the stack 114 etch. However, in a cross-point architecture, no oxide layer 126 resides between the stack 114 and conductive line 112, and therefore, where to stop the stack 114 etch is important. In such a cross-point cell architecture, the first conductive lines are disposed directly under the seed layer 136, as shown in FIG. 8 at 336. If the seed layer 136/336 is etched with a chlorine-based chemistry or if the stack 114/314 etch breaks through the relatively thin seed layer 136/336, the first conductive lines 112/312, which preferably comprise copper, will be exposed to the chlorine with severe risk of corrosion of the copper. Therefore using a fluorine-based chemistry for the seed layer 136/336 and as an etch stop for the stack 114/314 etch on the seed layer is advantageous.

Processing of the MRAM device 110 is continued, as shown in FIG. 6. A tunnel junction isolation layer 132 may be deposited over the MTJ's 114 and hard mask 142, as shown The tunnel junction isolation layer 132 preferably comprises a nitride such as $Si_3N_4$ and may alternatively comprise an oxide, for example. The tunnel junction isolation layer 132 is planarized using for example, a CMP process, and a second insulating layer 134 is deposited over the wafer 110. The second insulating layer 134 may comprise an inter-level dielectric, for example, soon as $SiO_2$ or other low-dielectric materials such as SILK™, as examples.

A damascene process may be used to form second conductive lines 122 within the second insulating layer 34, as shown in FIG. 6. Second conductive lines 122 may be part of a metallization layer, and may comprise the same material or a different material than the first conductive lines 112, for example.

Figure 7:
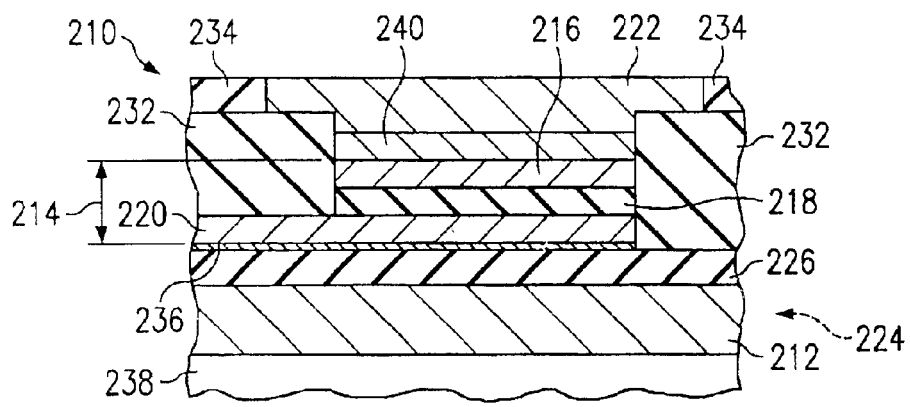
FIG. 7 shows a cross-sectional view of an embodiment of the invention with the hard mask removed.

FIG. 7, in which like numerals depict like elements as in FIGS. 4–6, shows a cross-sectional view of an embodiment of the invention wherein the hard mask 242 (not shown) is removed before forming second conductive lines 222. FIG. 8 shows an embodiment of the invention implemented in a MRAM having a cross-point architecture, with no oxide layer 126/226 disposed over the first conductive lines 312, but rather, seed layer 336 directly contacts the first conductive lines 312.

Table 1 discloses preferred material combinations for the hard mask 142/242/342, TJ isolation layer 132/232/332, cap layer 140/240/340, and first and second ILD 124/224/324. Advantageously, a seed layer 136/236/336 comprising copper may be used in combination with each of the embodiments shown in Examples 1, 2 and 3, for example, in accordance with an embodiment of the invention.

TABLE 1

| Material layer | Example 1 | Example 2 | Example 3 |
| --- | --- | --- | --- |
| Hard mask material 142/242/342 | TiN or TaN | WN | WN |
| Tunnel junction isolation material 132/232/332 | $Si_3N_4$ | $Si_3N_4$ | $SiO_2$ |
| Cap layer 140/240/340 | WN | TaN | TiN |
| Inter-level dielectric dielectric 124/224/324 | $SiO_2$ | $SiO_2$ | Organic dielectric |

While each of the material combination Examples 1, 2, and 3 shown in Table 1 are advantageous, there are various features provided by each example. In Example 1, a cap layer 140/240/340 comprising WN is advantageous in that good etch selectivity to TiN is provided, and the conductivity is of a desired amount, e.g., 0.5 Ω μm for WN versus a conductivity of 1.8 Ω μm for TaN. Example 2 comprises essentially a reversed Example 1, having less selectivity to the inter-level dielectric layer 124/224/324 than Example 1. In Example 3, the hard mask material comprising WN has good selectivity to the inter-level dielectric 124/224/324, the $SiO_2$ has well-known chemical-mechanical polishing (CMP) processes associated therewith, and using TiN as a cap layer 140/240/340 provides good selectivity to the hard mask material 142/242/342. Furthermore, the use of organic dielectric materials such as SILK™ is common in the art, and thus no special processes or equipment are required.

In one embodiment of the present invention, WN is used as the TJ stack cap layer 140/240/340. WN is stable in an oxidizing environment (e.g. air, oxygen or halogen containing plasmas) with respect to its sheet resistance. WN has a lower specific resistance of 0.5 Ω μm than TaN and good etch selectivity to hard mask material 142/242/343 open RIE, since W or its alloys hardly etch in chlorine-based plasmas (whereas TiN or TaN are etched using chlorine chemistry). On the other hand, W or its alloys can be easily etched in fluorine-based plasmas in order to pattern them. Because W alloys are easily etched in fluorine-based plasmas, this results in the ability to, even after completing metallization layer M3 RIE, when the remaining hard mask material is exposed, thinning the WN in order to lower the contact resistance without the risk of destroying the TJ cap layer in the case of a break-through of the hard mask material 142/242/343.

A hard mask material 142/242/342 open RIE can be stopped on WN, giving better control to the tunnel junction (TJ) etch, for example, in Example 1 of Table 1. In the case of the offset cell TJ etch is stopped within the TJ stack to maintain the transistor contact metallization strip, e.g., that contacts magnetic layer 120, in FIG. 6, not shown.

Improving control of the TJ etch starting point in accordance with embodiments of the invention results in the ability to keep the remaining thickness of the magnetic layer 120 within specification, which makes the contact to the FET. In the case of a cross-point architecture cell over-etch time of TJ, the etch can be minimized in order not to etch into the metallization layer 112/212/312 M2 copper which would create a rough Cu surface due to grain directional etching.

Using a WN TJ stack cap layer 140/240/340 may improve overall process latitudes, especially for the FET cell where after TJ etch the remaining Mx thickness is critical. In this embodiment, preferably the hard mask material 142/242/342 comprises a conductive nitride such as TaN or TiN, as examples.

In another embodiment, e.g., Examples 2 and 3 of Table 1, WN may be used as the TJ hard mask material 142/242/342; however, in this case the TJ stack cap layer preferably comprises a conductive nitride such as TaN or TiN, as examples. Since the hard mask material 142/242/342 open RIE will be a fluorine-based process because of the WN hard mask material 142/242/342, it will stop on TaN or TiN, because TiN etches even less in fluorine chemistry. A challenge with this combination is the lower etch selectivity of the WN to the normal $SiO_2$ ILD trench etch for the next metal level. To overcome this, an organic ILD such as SILK™ or polybenzoxazol may be used rather than $SiO_2$ for the ILD material 134/234/334.

Also disclosed herein is a method of fabricating a resistive semiconductor memory device, comprising providing a workpiece, forming a first inter-level dielectric over the workpiece, and disposing a plurality of first conductive lines within the first inter-level dielectric. The method includes forming a seed layer over the first conductive lines, forming a first magnetic layer over the seed layer, and forming a tunnel barrier layer over the first magnetic layer. A second magnetic layer is deposited over the tunnel barrier, a cap layer is deposited over the second magnetic layer, and a hard mask material is deposited over the cap layer. The method includes depositing a resist over the hard mask, patterning the resist, and removing portions of the resist to expose regions of the hard mask material. The resist is used to pattern the hard mask material and form a hard mask. The patterned hard mask is used to pattern the cap layer, second magnetic layer, and tunnel barrier layer to form a plurality of tunnel junctions. The cap layer or hard mask layer and/or seed layer comprise WN.

Advantageously, the hard mask 142 may comprise a material suitable to be left remaining in the finished MRAM device, as shown in FIGS. 6 and 8. Alternatively, the hard mask 142 may be removed from over the MTJ's 214 before completing the fabrication of the MRAM device, as shown in an alternative embodiment in FIG. 7.

Advantages of embodiments of the invention include providing a well-defined hard mask open etch stop on a cap layer that optimizes the tunnel junction etch process and solves re-deposition problems that can occur due to over-etching, or undercutting, in the case of wet etching. Embodiments of the invention are particularly useful in FET cell and in a chlorine-based RIE, for which there is no natural etch stop for the metallization layer or wet etch, which stops on the tunnel barrier layer.

Embodiments of the present invention are described with reference to a particular application for FET-like and cross-point MRAM devices shown herein; however, embodiments of the invention also have application in other MRAM device designs and other resistive semiconductor devices.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of fabricating a resistive semiconductor memory device, comprising:
   providing a workpiece;
   forming a first inter-level dielectric over the workpiece;
   disposing a plurality of first conductive lines within the first inter-level dielectric;
   forming a seed layer over the first conductive lines by depositing a material selected from the group consisting of WN and TaN;
   forming a first magnetic layer over the seed layer;
   forming a tunnel barrier layer over the first magnetic layer;
   depositing a second magnetic layer over the tunnel barrier layer;
   depositing a cap layer over the second magnetic layer;
   depositing a hard mask material over the cap layer;
   patterning the hard mask material to form a hard mask;
   using the patterned hard mask to pattern the cap layer, second magnetic layer, and tunnel barrier layer to form a plurality of tunnel junctions; and
   patterning the first magnetic layer with a different pattern than that of the second magnetic layer.

2. The method according to claim 1, wherein depositing the cap layer comprises depositing WN and wherein depositing the hard mask material comprises depositing a conductive nitride.

3. The method according to claim 1, wherein depositing the hard mask material comprises depositing WN and wherein depositing the cap layer comprises depositing a conductive nitride.

4. The method according to claim 1, further comprising depositing a tunnel junction isolation material between the plurality of tunnel junctions.

5. The method according to claim 4, wherein depositing the tunnel junction isolation material comprises depositing $Si_3N_4$ or $SiO_2$.

6. The method according to claim 4, further comprising depositing a second inter-level dielectric over the tunnel junction isolation material.

7. The method according to claim 6, wherein depositing the second inter-level dielectric comprises depositing $SiO_2$ or an organic dielectric material.

8. The method according to claim 1, further comprising removing the hard mask material after patterning the cap layer.

9. The method according to claim 1, wherein depositing a hard mask material comprises depositing approximately 200 to 2000 Å of a conductive material and wherein depositing the cap layer comprises depositing approximately 75 to 250 Å of material.

10. The method according to claim 1, wherein the resistive semiconductor memory device comprises a magnetic random access memory (MRAM) device.

11. The method according to claim 1, further comprising depositing an oxide over the first conductive lines, wherein the seed layer is formed over the oxide, wherein the oxide is coupled to a field-effect transistor.

12. The method according to claim 1, wherein patterning the hard mask materials to form a hard mask comprises:

depositing a resist over the hard mask;

patterning the resist;

removing portions of the resist to expose regions of the hard mask material; and using the resist to pattern the hard mask material and form a hard mask.

13. A resistive semiconductor memory device fabricated in accordance with the method of claim 1.

14. The method of claim 1 wherein at least one of the steps of depositing a cap layer and depositing a hard mask material comprises depositing WN.

15. A resistive semiconductor memory device, comprising:

a plurality of first conductive lines;

a seed layer disposed over at least a portion of the first conductive lines, said see layer being a material selected from the group consisting of WN and TaN;

a first magnetic layer having a first pattern and disposed over the seed layer;

a tunnel barrier disposed over the first magnetic layer;

a second magnetic layer having a second pattern different than said first pattern and disposed over the tunnel barrier; and a cap layer disposed over the second magnetic layer.

16. The resistive semiconductor memory device according to claim 15, wherein the cap layer comprises approximately 75 to 250 Å of material.

17. The resistive semiconductor memory device according to claim 15, further comprising a hard mask material disposed over the cap layer, wherein at least one of the hard mask material or the cap layer comprises WN.

18. The resistive semiconductor memory device according to claim 17, wherein the hard mask material comprises approximately 200 to 2000 Å of material.

19. The resistive semiconductor memory device according to claim 17, wherein the hard mask material comprises WN and the cap layer comprises a conductive nitride.

20. The resistive semiconductor memory device according to claim 17, wherein the hard mask material comprises a conductive nitride and the cap layer comprises WN.

21. The resistive semiconductor memory device according to claim 17, wherein the seed layer comprises WN.

22. The resistive semiconductor memory device according to claim 15, wherein the resistive semiconductor memory device comprises a magnetic random access memory (MRAM) device, wherein the seed layer, first magnetic layer, tunnel barrier, and second magnetic layer are patterned to form magnetic tunnel junctions (MTJ's).

23. The resistive semiconductor memory device according to claim 22, further comprising a plurality of second conductive lines disposed over the MTJ's.

24. The resistive semiconductor memory device according to claim 23, further comprising:

a workpiece disposed beneath the first conductive lines;

a first inter-level dielectric disposed over the workpiece, wherein the first conductive lines are formed within the first inter-level dielectric;

a tunnel junction isolation material disposed over the first inter-level dielectric between the plurality of MTJ's; and a second inter-level dielectric disposed over the tunnel junction isolation material, wherein the second conductive lines are formed within the second inter-level dielectric.

25. The resistive semiconductor memory device according to claim 15, wherein depositing the tunnel junction isolation material comprises depositing $Si_3N_4$ or $SiO_2$, and wherein depositing the second inter-level dielectric comprises depositing $SiO_2$ or an organic dielectric material.

26. The resistive semiconductor memory device according to claim 15, further comprising an oxide disposed over the first conductive lines, wherein the seed layer is formed over the oxide, wherein the oxide is coupled to a field-effect transistor.

27. The resistive semiconductor memory device according to claim 15, wherein the cap layer comprises WN.

28. The resistive semiconductor memory device according to claim 15, wherein the seed layer comprises WN.

* * * * *